United States Patent [19]

Watanabe

[11] Patent Number: 4,724,344

[45] Date of Patent: Feb. 9, 1988

[54] SENSING AMPLIFIER INCLUDING SYMMETRICAL AND ASYMMETRICAL LOAD CIRCUITS

[75] Inventor: Kazuo Watanabe, Kanagawa, Japan

[73] Assignee: Sony Corporation, Tokyo, Japan

[21] Appl. No.: 845,649

[22] Filed: Mar. 28, 1986

[30] Foreign Application Priority Data

Mar. 29, 1985 [JP] Japan .................................. 60-65876

[51] Int. Cl.[4] .......................................... H03K 17/693
[52] U.S. Cl. .................... 307/530; 307/355; 307/497; 365/208
[58] Field of Search ............... 307/530, 355, 494, 496, 307/497; 365/190, 205, 207, 208

[56] References Cited

U.S. PATENT DOCUMENTS

| | | | |
|---|---|---|---|
| 4,223,394 | 9/1980 | Pathak et al. | 307/530 X |
| 4,375,039 | 2/1983 | Yamauchi | 307/530 |
| 4,471,244 | 9/1984 | Maples | 307/530 |
| 4,479,202 | 10/1984 | Uchida | 365/190 |
| 4,509,147 | 4/1985 | Tanimura et al. | 365/190 |
| 4,539,494 | 9/1985 | Kurafuji | 307/530 |
| 4,598,215 | 7/1986 | Schechtman et al. | 307/494 X |
| 4,604,533 | 8/1986 | Miyamoto et al. | 307/530 |

*Primary Examiner*—Stanley D. Miller
*Assistant Examiner*—D. R. Hudspeth
*Attorney, Agent, or Firm*—Philip M. Shaw, Jr.

[57] ABSTRACT

A sensing amplifier for a random access memory (RAM) having a first differential amplifying circuit formed of a first pair of transistors having their sources connected together, their gates supplied with differential input signals, and their drains connected with symmetrical type active loads; and a second differential amplifying circuit of a current mirror type formed of a pair of transistors which is connected in series with the first differential amplifying circuit.

15 Claims, 2 Drawing Figures

PRIOR ART

SENSING AMPLIFIER INCLUDING SYMMETRICAL AND ASYMMETRICAL LOAD CIRCUITS

BACKGROUND OF THE INVENTION

1. Field of the Invention

This invention relates generally to sensing amplifiers and, more particularly, is directed to a sensing amplifier for a random access memory (RAM) that is suitably used to amplify a signal read out from a memory.

2. Description of the Prior Art

In the prior art, a sensing amplifier is used to amplify a signal having quite a low level read out from an internal storage or external storage (memory) of an electronic computer such that the level of such a signal read out reaches the voltage level to be processable by a logic circuit.

An example of a prior art sensing amplifier will be described with reference to FIG. 1. FIG. 1 is a schematic diagram showing a construction of such a prior art sensing amplifier.

Referring to FIG. 1, a memory cell 10 is provided, which is a component of a metal oxide semiconductor (MOS) memory matrix, not shown. The memory cell 10 includes a flip-flop circuit formed of load resistors 11 and 12, and metal oxide semiconductor field effect transistors (MOSFET's) 13 and 14. This memory cell 10 is of a static type memory which stores information each time the MOSFET's 13 and 14 are turned on or off. When the memory cell 10 is put in the reading mode, if an X address (word line) 21 is selected by an X decoder, not shown, MOSFET's 15 and 16 connected to this word line 21 are turned on, and the information stored in the memory cell 10 is transferred to Y addresses (bit lines) 22a and 22b. In this case, since the memory cells on the same word line 21 are all activated, a selection signal for predetermined Y addresses (bit lines) 22a and 22b are supplied through a selection line 23 to MOSFET's 24a and 24b from a Y decoder, not shown. Then, the MOSFET's 24a and 24b are turned on, supplying the information of the predetermined memory cell 10 through the bit lines 22a and 22b to the sensing amplifier.

A first stage amplifying circuit 30 of the sensing amplifier is formed as a current mirror type differential amplifying circuit. To be more concrete, the first stage amplifying circuit 30 comprises N-channel differential input MOSFET's 31 and 32 whose gates are respectively connected to the bit lines 22a and 22b. The sources of both the MOSFET's 31 and 32 are connected together to a drain of a third N-channel MOSFET 33 that serves as a constant current source. The source of the MOSFET 33 is grounded and the gate thereof is connected to a voltage source terminal TP and thereby the MOSFET 33 is turned on. The drains of both the N-channel MOSFET's 31 and 32 are connected respectively to drains of a pair of P-channel MOSFET's 34 and 35, each of which is used as an active load. The gate and the drain of the P-channel MOSFET 34 are directly coupled together to serve as a diode, while the gate of the other P-channel MOSFET 35 is connected to the gate of the MOSFET 34. Then, the sources of both the P-channel MOSFET's 34 and 35 are connected to the power source terminal TP. Thus, the current mirror circuit is constructed.

In the above-mentioned differential amplifying circuit 30, potentials or voltages having voltage levels corresponding to the on or off state of both the input differential MOSFET's 13 and 14 in the memory cell 10 and generated on both the bit lines 22a and 22b are supplied to the gates of both the input differential MOSFET's 31 and 32 as input signals thereof. A difference signal between these input signals is amplified and from a connection point A between the MOSFET's 32 and 35, an unbalanced output signal of the differential amplifying circuit 30 is supplied to a driving stage, inverting amplifying circuit 36. The output signal from this inverting amplifying circuit 36 is supplied to an output stage, buffer amplifying circuit 37. The output signal from the output amplifying circuit 37 has already reached a predetermined voltage level, and it is delivered through an output terminal 38 to a logic circuit, not shown.

A sensing amplifier used for a memory capable of operating at high speed and producing multiple-outputs, the output amplifying circuit 37 has a large driving capacity. Thus, when a load having a large capacity is connected to the output terminal 38, a transient current having a large amplitude flows through the output amplifying circuit 37 to the voltage source and the ground, generating high frequency noises. The noises are supplied through the voltage source and the ground to the differential amplifying circuit 30 in the same phase.

Of course, as is well known in the art, the differential amplifying circuit amplifies a difference signal between two input signals and it does not amplify the input voltages having the same phase. However, in the conventional current mirror type differential amplifying circuit 30 shown in FIG. 1, the MOSFET 34 forming a part of the current mirror circuit is connected so as to operate as a diode and is low in impedance, while the other MOSFET 35 is high in impedance so that the loads to both the input differential FET's 31 and 32 are made asymmetric. As a result, when the high frequency response characteristic of the constant current source FET 33 is not sufficient, the above-mentioned noise components having the same phase can not be cancelled out within the differential amplifying circuit 30 and appear at the junction a between the MOSFET's 32 and 35, preventing a signal from being read out correctly from the memory.

OBJECTS AND SUMMARY OF THE INVENTION

Accordingly, it is an object of the present invention to provide an improved sensing amplifier for a random access memory (RAM) which can remove the defects encountered with a prior art sensing amplifier.

It is another object of the present invention to provide a sensing amplifier for a random access memory which can remove noise components having the same phase.

The above and other objects are achieved by the present invention of a sensing amplifier for a random access memory which includes a first differential amplifying circuit formed of a first pair of transistors having their sources connected together, their gates supplied with differential input signals and their drains connected with symmetrical type positive loads, and a second differential amplifying circuit of a current mirror type which is connected in series with said first differential amplifying circuit.

These and other objects, features and advantages of the present invention will become apparent from the following detailed description of the preferred embodiment taken in conjunction with the accompanying drawing, throughout which like reference numerals designate like elements and parts.

DESCRIPTION OF THE PREFERRED EMBODIMENT

Figure 1:
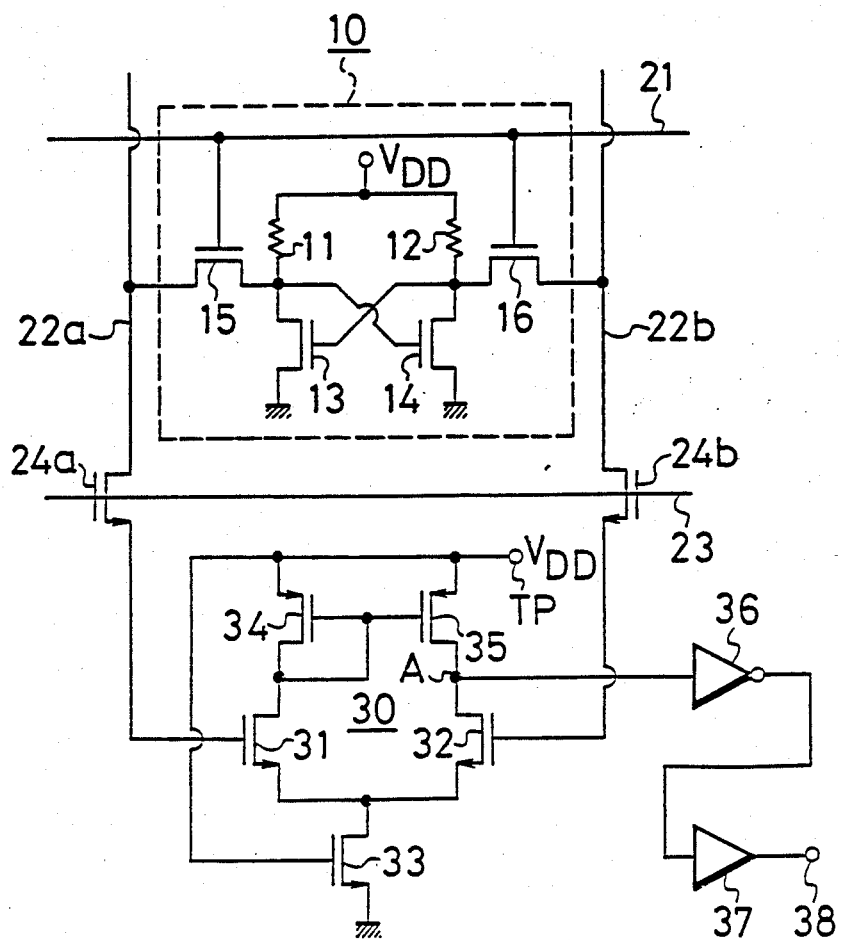
FIG. 1 is a schematic diagram showing a construction of a prior art sensing amplifier.
Figure 2:
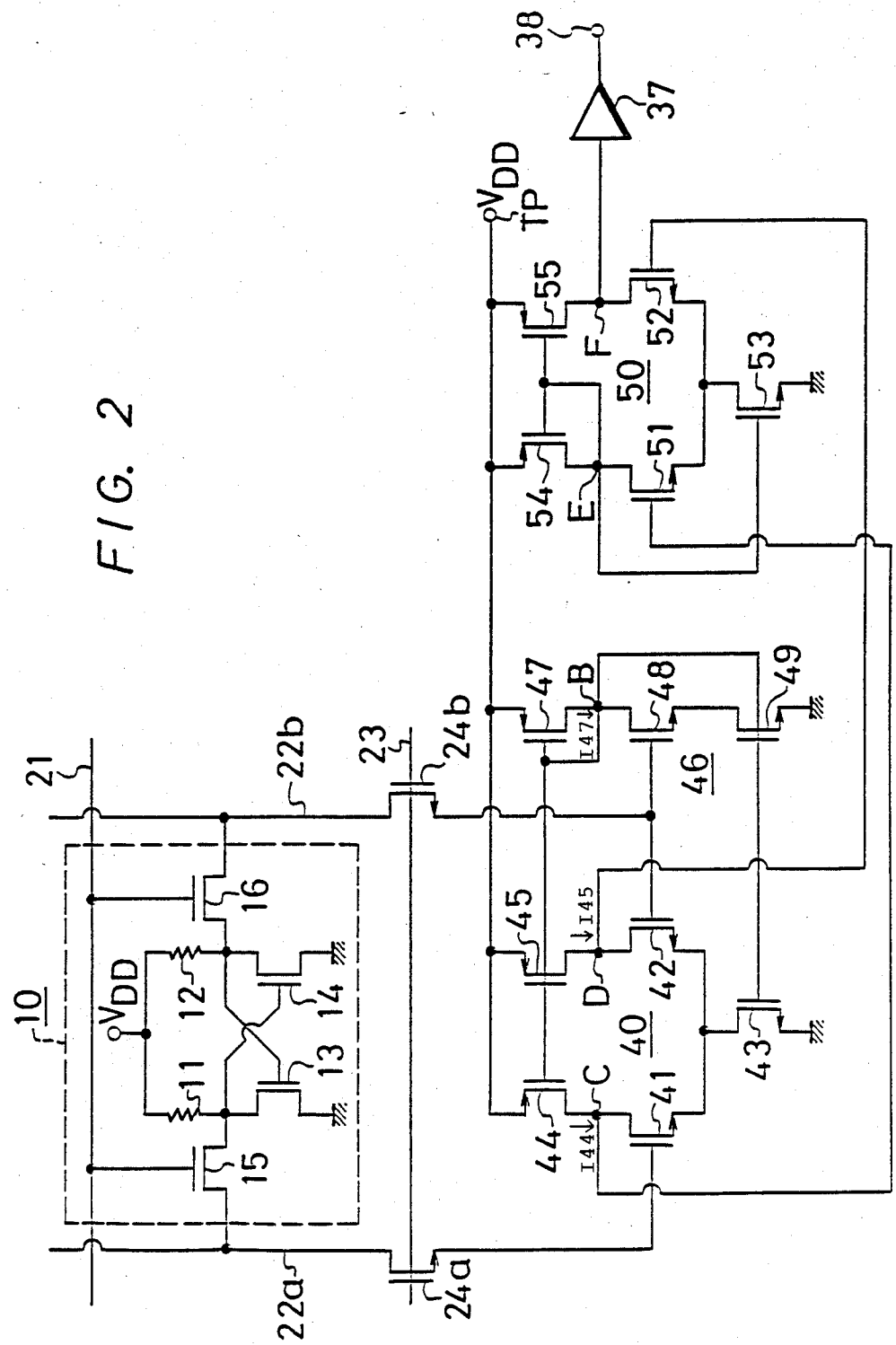
FIG. 2 is a schematic diagram showing an embodiment of a sensing amplifier for a random access memory according to the present invention.

Referring now to FIG. 2, the circuit arrangement of the preferred embodiment of the invention is shown. In FIG. 2, like parts corresponding to those of FIG. 1 are marked with the same references and will not be described in detail.

A first stage amplifying circuit 40 is of a differential amplifying circuit type which includes symmetrical active loads. Specifically, the bit lines 22a and 22b are respectively connected to gates of N-channel differential input MOSFET's 41 and 42 in the first differential amplifying circuit 40. The sources of both the MOSFET's 41 and 42 are connected together to a drain of a third N-channel MOSFET 43 that serves as a constant current source. The source of the MOSFET 43 is grounded. The drains of both the N-channel MOSFET's 41 and 42 are connected respectively to drains of a pair of P-channel MOSFET's 44 and 45 which become symmetrical active loads. The sources of the MOSFET's 44 and 45 are both connected to a power source terminal TP.

A bias circuit 46 supplies a bias voltage to the first stage amplifying circuit 40. The bias circuit 46 comprises one P-channel MOSFET 47 and two N-channel MOSFET's 48 and 49 which are connected in series between the power source terminal TP and the ground. In other words, in the bias circuit 46, the source and the drain of the P-channel MOSFET 47 are respectively connected to the power source terminal TP and the drain of the N-channel MOSFET 48, the source of the MOSFET 48 and the drain of the MOSFET 49 are connected together, and the source of the MOSFET 49 is grounded.

The gate and the drain of the P-channel MOSFET 47 are directly coupled to each other so as to operate as a diode and from a junction B at the connection between the MOSFET's 47 and 48, a bias voltage is commonly supplied to the gates of the pair of P-channel MOSFET's 44 and 45 in the differential amplifying circuit 40. Also, from this junction B, the common bias voltage is supplied to the gate of the MOSFET 49 of the bias circuit 46 and to the gate of the MOSFET 43 serving as the constant current source of the differential amplifying circuit 40. The gate of the MOSFET 48 in the bias circuit 46 is connected to the gate of the MOSFET 42 in the differential amplifying circuit 40. The differential amplifying circuit 40 generates balanced outputs at a junction C between the input differential MOSFET 41 and the active load, i.e., MOSFET 44, and a junction D between the input differential MOSFET 42 and the active load, i.e., MOSFET 45.

A driving stage amplifying circuit 50 is formed as a current mirror-type differential amplifying circuit similar to the foregoing first stage amplifying circuit 30 shown in FIG. 1. Therefore, in the driving stage differential amplifying circuit 50 shown in FIG. 2, like parts corresponding to those of the first stage amplifying circuit 30 are marked with reference numerals similar to those in FIG. 1 in which reference numerals on the first order are not changed but reference numerals on the second order are replaced with "5". Thus, the circuit arrangement thereof will not be described in detail.

In this differential amplifying circuit 50, the gate of the MOSFET 53 serving as the constant current source is supplied with the bias voltage from the MOSFET 54 whose gate and drain are coupled so as to operate as a diode in the current mirror circuit. The drain of the MOSFET 54 is connected to the drain of the MOSFET 51 and a junction E therebetween is connected to the gate of the MOSFET 53.

In the driving stage differential amplifying circuit 50, the differential input MOSFET's 51 and 52 are supplied at their gates with the balanced outputs from the junctions C and D, respectively, of the first stage differential amplifying circuit 40. From the junction E between the drains of the MOSFET's 51 and 54, there is supplied a bias voltage to the gate of the MOSFET 55. Further, from a junction F between the MOSFET's 52 and 55, an unbalanced output of the differential amplifying circuit 50 is supplied to the output amplifying circuit 37. An output having a predetermined level from this output amplifying circuit 37 is delivered to the output terminal 38.

The operation of the sensing amplifier according to the above embodiment will now be described.

The active loads, i.e., MOSFET's 44 and 45 in the differential amplifying circuit 40 and the MOSFET 47 whose gate and drain are coupled so as to operate as a diode in the bias circuit 46 are respectively formed to occupy the same dimension or area. For this reason, drain currents I44 and I45 of both the MOSFET's 44 and 45 become equal to a drain current I47 of the MOSFET 47. Further, since a drain current equal to those of the respective input differential MOSFET's 41 and 42 flows through the MOSFET 48 in the bias circuit 46, DC voltage drops across both the input differential MOSFET's 41 and 42 and across the bias MOSFET 48 become equal to one another. Accordingly, also DC voltage drops across the active loads, i.e., the MOSFET's 44 and 45 in the first stage differential amplifying circuit 40 become equal to each other so that both the active loads, i.e., the MOSFET's 44 and 45 become sufficiently symmetrical to each other.

Both the junctions C and D of the first stage differential amplifying circuit 40 are respectively connected to the gates of the differential input MOSFET's 51 and 52 in the driving stage differential amplifying circuit 50, so that the first stage differential amplifying circuit 40 is made sufficiently symmetrical (balanced) in the circuit arrangement from its input circuit to its output circuit.

Therefore, according to this embodiment, even when the noise components which are the same in phase enter through the power source terminal and the ground, as mentioned before, the noise components having the same phase can be removed well within the first stage differential amplifying circuit 40 so that they can be prevented from being transmitted to the driving stage differential amplifying circuit 50.

Moreover, since the driving stage amplifying circuit 50 is formed of a differential amplifying circuit and the DC voltages having the same phase applied to the input differential MOSFET's 51 and 52 thereof can be varied over a wide range, when the input differential MOS- FET's 51 and 52 are respectively connected to the pair of junctions (output terminals) C and D of the first stage differential amplifying circuit 40, it is not necessary to take a DC level difference therebetween into consideration.

According to the present invention as described above in detail, since the first stage differential amplifying circuit is formed as a symmetrical (balanced) type and the driving stage circuit is formed as a differential amplifying circuit, it is possible to obtain a sensing amplifier which can sufficiently remove noise components which are the same in phase and which is free from the consideration of the DC level difference between the stages.

The above description is given on a single preferred embodiment of the invention but it will be apparent that many modifications and variations could be effected by one skilled in the art without departing from the spirit or scope of the novel concepts of the invention so that the scope of the invention should be determined by the appended claim only.

What is claimed is:

1. A sensing amplifier for use with a random access memory, the sensing amplifier comprising
   (a) a constant current source;
   (b) a first differential amplifying circuit including symmetrical type active loads and formed of a first pair of transistors having their sources connected together to the constant current source, their gates supplied with differential input signals, and their drains connected with the symmetrical type active loads;
   (c) a second differential amplifying circuit having a current mirror load and being connected in cascade with said first differential amplifying circuit;
   (d) a power source and wherein said symmetrical type active loads comprise a second pair of transistors each of which is separately connected in series between a different one of the drains of said first pair of transistors and the power source; and
   (e) a bias voltage source and wherein said second pair of transistors have their sources connected to said power source, their gates connected together to the bias voltage source to be supplied with the bias voltage, and each of their drains connected with a different one of the drains of said first pair of transistors.

2. The sensing amplifier as claimed in claim 1, wherein the constant current source comprises a first transistor whose drain is connected to the sources of the first pair of transistors, whose source is grounded, and whose gate is supplied with the bias voltage from the bias voltage source.

3. The sensing amplifier as claimed in claim 1, wherein said second differential amplifying circuit comprises a pair of current-mirrorcoupled load transistors which function as asymmetrical type active loads, a second constant current source, a third pair of transistors having their sources connected together to the second constant current source, each of their gates connected to separate drains of said first pair of transistors, and their drains connected with the current-mirror-coupled load transistors.

4. The sensing amplifier as claimed in claim 3, wherein said asymmetrical type active loads comprise a fourth pair of transistors each of which is separately connected in series between a different one of the drains of said third pair of transistors and the power source.

5. The sensing amplifier as claimed in claim 4, wherein said fourth pair of transistors have their sources connected to said power source, their gates connected together, and each of their drains connected with a different one of said drains of said third pair of transistors.

6. The sensing amplifier as claimed in claim 5, wherein the gates of said fourth pair of transistors are connected to one of the drains of said third pair of transistors, the other of the drains of said third pair of transistors providing an output signal.

7. A sensing amplifier for a random access memory, said random access memory providing readout memory signals, comprising
   a bias circuit for generating a bias voltage; a first differential amplifying circuit for receiving both the readout memory signals and the bias voltage, for generating balanced differential signals, and which includes symmetrical active loads;
   a second differential amplifying circuit for receiving the balanced differential signals, for generating an output signal representative of the readout memory signals, whereby transients produced by external circuitry do not affect the output, and which includes asymemtrical active loads;
   a first constant current source and wherein said first differential amplifying circuit comprises a first pair of transistors having their gates supplied with a different one of the readout memory signals, their sources connected to the first constant current source, and their drains connected to a different one of said symmetrical active loads; and
   a source of power and wherein said symmetrical active loads comprise a second pair of transistors having their gates connected together to the bias circuit to be supplied with the bias voltage, their sources connected to the power source, and each of their drains is connected to a different one of the drains of said first pair of transistors.

8. The sensing amplifier as claimed in claim 7, wherein said bias circuit comprises
   a circuit ground;
   a first transistor for generating the bias voltage, said first transistor having its source connected to the power source and its drain and gate connected together to form a bias voltage node; and
   a second transistor and a third transistor and wherein the second transistor has its gate connected to one of the readout memory signals, its drain connected to the drain of the first transistor, and its source connected to the drain of the third transistor; and the third transistor has its gate connected to the drains of both the first and second transistors, and its source connected to the circuit ground.

9. The sensing amplifier as claimed in claim 7, further comprising a second constant current source and wherein said second differential amplifying circuit comprises a third pair of transistors having their gates connected to receive a different one of the balanced differential signals, their sources connected to the second constant current source, and their drains connected to separate, asymmetrical active loads.

10. The sensing amplifier as claimed in claim 9, wherein said asymmetrical active loads comprise a fourth pair of transistors having their gates connected to the drain of one of the third pair of transistors, their sources connected to the power source, and each of their drains is connected to a different one of the drains of the third pair of transistors, whereby the output signal is taken at the drain of the other of the third pair of transistors.

11. A sensing amplifier for a random access memory, said random access memory providing readout memory signals, comprising
   a power source;
   a bias circuit for generating a bias voltage;
   a first differential amplifying circuit that includes:
      symmetrical active loads; and
      a first constant current source;
      a first pair of transistors having their gates supplied with the readout memory signals, their sources connected to the first constant current source, and their drains connected to said symmetrical active loads; and wherein
      the symmetrical active loads include a second pair of transistors having their gates connected together to the bias circuit to be supplied with the bias voltage, their sources connected to the power source, and each of their drains connected to a different one of the drains of said first pair of transistors, thereby generating a pair of balanced differential signals at the drains of the first and second pair of transistors; and
   a second differential amplifying circuit which includes:
      asymmetrical active loads;
      a second constant current source;
      a third pair of transistors which are connected in cascade with said first pair of transistors, said third pair of transistors having their gates connected to receive a different one of the balanced differential signals, their sources connected with the second constant current source, and their drains connected to the asymmetrical active loads; and wherein
      the asymmetrical active loads include
         a fourth pair of transistors having their sources connected to the power source, each of their drains connected to a different one of the drains of the third pair of transistors, and their gates connected to one of the drains of the third pair of transistors whereby an output signal representative of the readout memory signals, but free of transients produced by external circuitry, is available at the drain of the other one of the third pair of transistors.

12. The sensing amplifier as claimed in claim 11, wherein said second constant current source comprises a circuit ground and a first transistor connected by its drain and source in series between the circuit ground and the third pair of transistors and with its gate biased in common with the gates of the fourth pair of transistors.

13. A sensing amplifier for a random access memory, said random access memory providing readout memory signals, comprising
   a power source;
   a bias circuit for generating a bias voltage;
   a first differential amplifying circuit that includes:
      symmetrical active loads; and
      a first constant current source;
      a first pair of transistors having their gates supplied with the readout memory signals, their sources connected to the first constant current source, and their drains connected to said symmetrical active loads; and wherein
      the symmetrical active loads include a second pair of transistors having their gates supplied with the bias voltage, their sources connected to the power source, and each of their drains connected to a different one of the drains of said first pair of transistors, thereby generating a pair of balanced differential signals at the drains of the first and second pair of transistors; and
   a second differential amplifying circuit which includes:
      asymmetrical active loads;
      a second constant current source;
      a third pair of transistors which are connected in cascade with said first pair of transistors, said third pair of transistors having their gates connected to receive a different one of the balanced differential signals, their sources connected with the second constant current source, and their drains connected to the asymmetrical active loads; and wherein
   the asymmetrical active loads include
      a fourth pair of transistors having their sources connected to the power source, each of their drains connected to a different one of the drains of the third pair of transistors, and their gates connected to one of the drains of the third pair of transistors whereby an output signal representative of the readout memory signals, but free of transients produced by external circuitry, is available at the drain of the other one of the third pair of transistors, and wherein
   said bias circuit comprises
      a circuit ground;
      a series connection of a first transistor, a second transistor and a third transistor, the first transistor having its source connected to the power source, and its drain and gate connected to each other and to the gates of the second pair of transistors of the symmetrical load; the second transistor having its gate connected to one of the readout memory signals, its drain connected to the drain of the first transistor, and its source connected to the drain of the third transistor; and the third transistor having its gate connected to the drains of both the first and second transistors, and its source connected to the circuit ground.

14. A sensing amplifier for a random access memory, comprising
   (a) a power source;
   (b) a first constant current source;
   (c) a first pair of transistors;
   (d) a pair of symmetrical, active loads including a second pair of transistors each of which is separately connected in series by its drain and source between a different one of the first pair of transistors and the power source and with the gates of the second pair of transistors being biased in common;
   (e) a first differential amplifying circuit formed of the first pair of transistors, each being connected by its source and drain in series with the first constant current source, a different one of the symmetrical loads, and the power source, and with its gate supplied with a different input signal, the outputs from the first differential amplifying circuit being taken from the connection points between each transistor of the first pair of transistors and its respective symmetrical load, (f) a second differential amplifying circuit which is connected in cascade with said first differential amplifying circuit; and wherein the first constant current source comprises a circuit ground and a first transistor connected by its drain and source in series between the circuit ground and the first pair of transistors and with its gate biased in common with the gates of the second pair of transistors.

15. A sensing amplifier for a random access memory, comprising
   (a) a power source;
   (b) a first constant current source;
   (c) a first pair of transistors;
   (d) a pair of symmetrical, active loads including a second pair of transistors each of which is separately connected in series by its drain and source between a different one of the first pair of transistors and the power source and with the gates of the second pair of transistors being biased in common;
   (e) a first differential amplifying circuit formed of the first pair of transistors, each being connected by its source and drain in series with the first constant current source, different one of the symmetrical loads, and the power source, and with its gate supplied with a different input signal, the outputs from the first differential amplifying circuit being taken from the connection points between each transistor of the first pair of transistors and its respective symmetrical load,
   (f) a second differential amplifying circuit which is connected in cascade with said first differential amplifying circuit; and
   (g) a circuit ground and a bias circuit which includes a first, a second, and a third transistor connected in series between the power source and the circuit ground, the gates of the first and the third transistors being connected together in common with the gates of the second pair of transistors of the symmetrical loads and to the junction connection between the first and the second transistor of the bias circuit, and the gate of the second transistor being connected to the gate of one of the first pair of transistors of the first amplifying circuit.

* * * * *